United States Patent [19]

Tsumura

[11] Patent Number: 5,748,129
[45] Date of Patent: May 5, 1998

[54] ANALOG TO DIGITAL CONVERTER CIRCUIT

[75] Inventor: Soichi Tsumura, Tokyo, Japan

[73] Assignee: NEC Corporation, Tokyo, Japan

[21] Appl. No.: 560,648

[22] Filed: Nov. 20, 1995

[30] Foreign Application Priority Data

Nov. 25, 1994 [JP] Japan .................. 6-315773

[51] Int. Cl.$^6$ .................. H03M 1/18
[52] U.S. Cl. .................. 341/155; 341/120
[58] Field of Search .................. 341/118, 120, 341/139, 155

[56] References Cited

U.S. PATENT DOCUMENTS

| | | | |
|---|---|---|---|
| 4,051,428 | 9/1977 | Imai | 323/4 |
| 4,851,842 | 7/1989 | Iwamatso | 341/139 |
| 5,119,211 | 6/1992 | Sakurai | 358/464 |
| 5,212,826 | 5/1993 | Rabe et al. | 455/214 |
| 5,231,398 | 7/1993 | Topper | 341/156 |

FOREIGN PATENT DOCUMENTS

| | | |
|---|---|---|
| 64-37121 | 2/1989 | Japan . |
| 231377 | 2/1990 | Japan . |
| 1156896 | 7/1969 | United Kingdom . |
| 1240686 | 7/1971 | United Kingdom . |
| 2119593 | 11/1983 | United Kingdom . |
| 2135552 | 8/1984 | United Kingdom . |

Primary Examiner—Jeffrey A. Gaffin
Assistant Examiner—Peguy JeanPierre
Attorney, Agent, or Firm—Sughrue, Mion, Zinn, Macpeak & Seas, PLLC

[57] ABSTRACT

An analog to digital converter circuit uses a reference voltage which increases in proportion to an intensity level of an input analog signal, or a reference signal which decreases in proportion to an intencity level of undesired signal components included in an input analog signal which AGC controlled, and thus maintains an adaptive quantizing level for a varying input signal level or a varynig desired signal level in an input signal without a DA converter.

5 Claims, 9 Drawing Sheets

ANALOG TO DIGITAL CONVERTER CIRCUIT

BACKGROUND OF THE INVENTION

This invention relates to an analog to digital converter (hereinafter abbreviated to an AD converter) circuit, and more particularly to an AD converter circuit whose dynamic range can be automatically controlled in accordance with input signal levels.

When an analog signal is converted to an equivalent digital signal by an AD converter, if the level of the analog signal is so small that it is digitized within a considerably low quantization level in comparison with the maximum quantization level usable in the AD converter, the quality of the converted digital signal is degraded by quantizing errors. In order to prevent the degradation, a circuit shown in FIG. 7 has heretofore been used, wherein a variable gain amplifier 51 and an analog level detector 52 are included.

Figure 7:
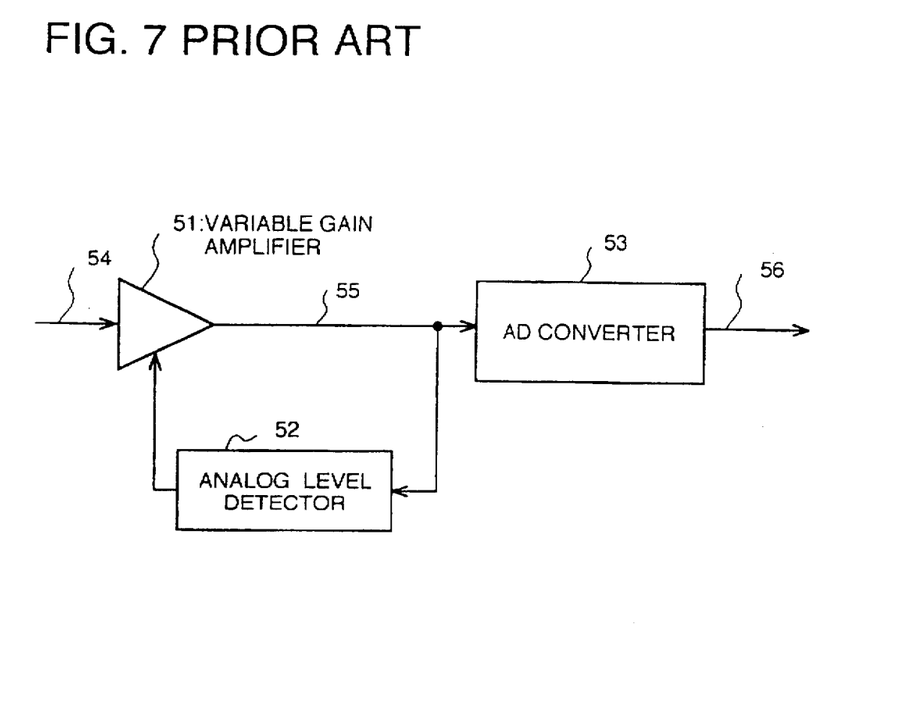
FIG. 7 shows a conventional AD converter circuit.

The analog level detector 52 detects the level of an analog signal 55 which is input to an AD converter 53 from the output of the variable gain amplifier 51. By negative feedback control of the variable gain amplifier 51 with the output of the analog level detector 52, the amplitude of the analog signal 55 is maintained at a relatively constant level, regardless of level fluctuations of an input analog signal 54. Thus, when a reference voltage of the AD converter 53 is set to a value appropriate to the level of the analog signal 55, a high quality digital signal 56 is obtained, with small quantizing errors.

However, there is a problem in the variable gain amplifier 51. Usually, the variable gain amplifier 51 is materialized by a variable transconductance operational amplifier with a current control circuit. Therefore, the characteristic of the variable gain amplifier 51 varies considerably by inequality of elements of the amplifier or by temperature change. So, sometimes it occurs that the amplified analog signal 55 exceeds the maximum quantizing range of the AD converter 53, or the amplified analog signal 55 remains so small as to be quantized within a considerably low quantization level in comparison with the maximum quantization level of the AD converter 53.

When the analog signal 55 exceeds the maximum quantizing range of the AD converter 53, the digital signal 56 will not be equivalent to the input analog signal 54, and when the analog signal 55 is so small as to be quantized within a considerably low quantizing level in comparison with the maximum quantizing level of the AD converter 53, the quantizing errors will become large.

Furthermore, there is another problem in the AD converter circuit of FIG. 7. The AD converter circuit is used in a variety of applications. For example, there is a radio receiver in a communication system using QPSK (quadrature phase shift keying) modulation system. The receiver demodulates the QPSK modulated signals, and desired signal components among the demodulated signals are digitized by AD converter circuits.

The receiver must exercise a well balanced AGC (automatic gain control) on the in-phase component (hereinafter abbreviated to I-component) and on the quadrature-phase component (hereinafter abbreviated to Q-component), and therefore the AGC is exercised in an intermediate frequency band (hereinafter abbreviated to IF band), and then an orhtogonal transformation is performed.

When broad band signal components corresponding to desired signals to be digitized are adjacent to narrow band undesired signal components, the undesired signal components can not effectively be attenuated in the IF band. Therefore, the narrow band undesired signal components must be sufficiently attenuated by notch filters or low pass filters after the signals are demodulated to a base band, and then, the desired signal components of a broad band are to be digitized.

Figure 8:
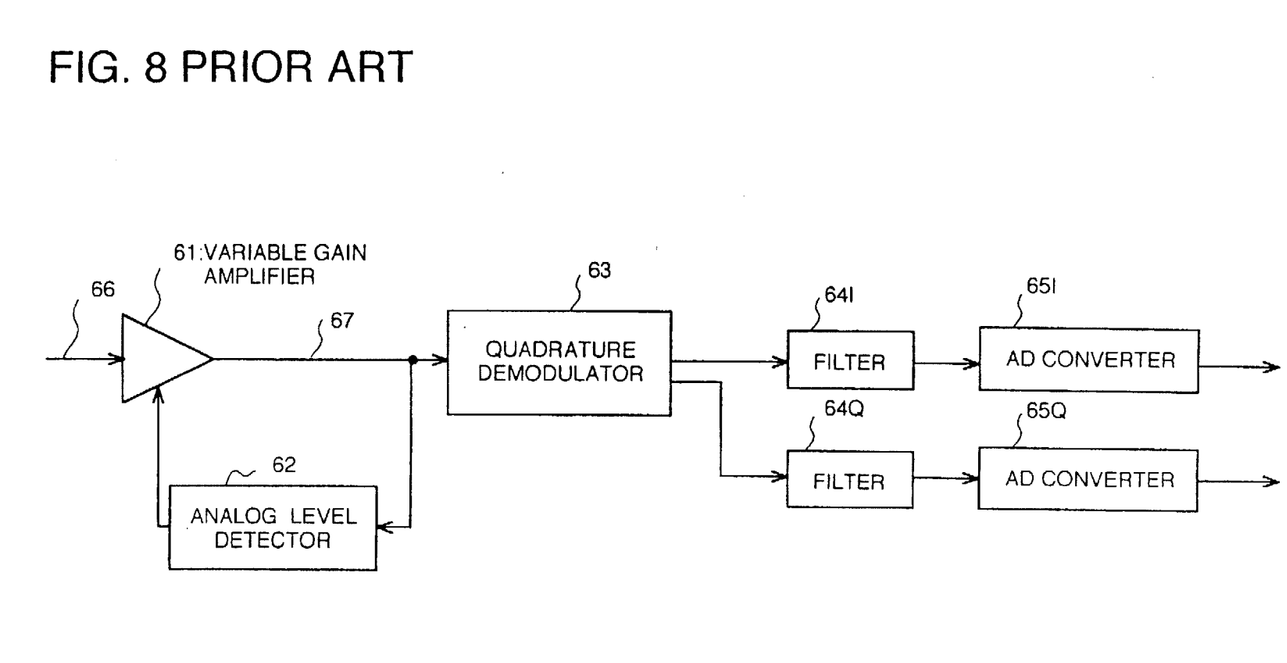
FIG. 8 is a block diagram of an apparatus wherein output signals of a quadrature demodulator are digitized by AD converter circuits of FIG. 7.

Therefore, when the AD converter circuit of FIG. 7 is used for digitizing the desired signal components in a receiver as described for receiving the QPSK modulated signals, the circuit of FIG. 7 must be modified, for example, to a circuit shown in FIG. 8.

An input analog signal 66 in the IF band is amplified by a variable gain amplifier 61, and the amplitude level of the output IF signal 67 of the variable gain amplifier 61 is detected by an analog level detector 62. Negative feedback control of the variable gain amplifier 61 with the output of the analog level detector 62 maintains an amplitude level of the output IF signal 67 at a relatively constant level.

The output IF signal 67 is demodulated to a base band I-component signal and a base band Q-component signal at a quadrature demodulator 63. Undesired signal components superimposed on the base band I-component signal and the base band Q-component signal are attenuated by filters 64I and 64Q respectively. After the undesired signal components are attenuated, the output of the filter 64I and the output of the filter 64Q are digitized at AD converters 65I and 65Q respectively.

The output IF signal 67 includes the desired signal and the undesired signal, and the output of the analog level detector 62 detects the resultant amplitude of the desired signal and the undesired signal. Therefore, if the undesired signal has a high level in the IF band, the gain of the variable gain amplifier 61 is unduly reduced for the desired signal. As a result, quantizing errors become large and the quality of the digital signals obtained is degraded.

Another type of an AD converter circuit is proposed, wherein a reference voltage of quantization is controlled in proportion to the level of the output signal of the AD converter.

For example, there is a Japanese patent application entitled "An AD converter circuit" and laid open in a Provisional Publication No. 37129/'89.

Figure 9:
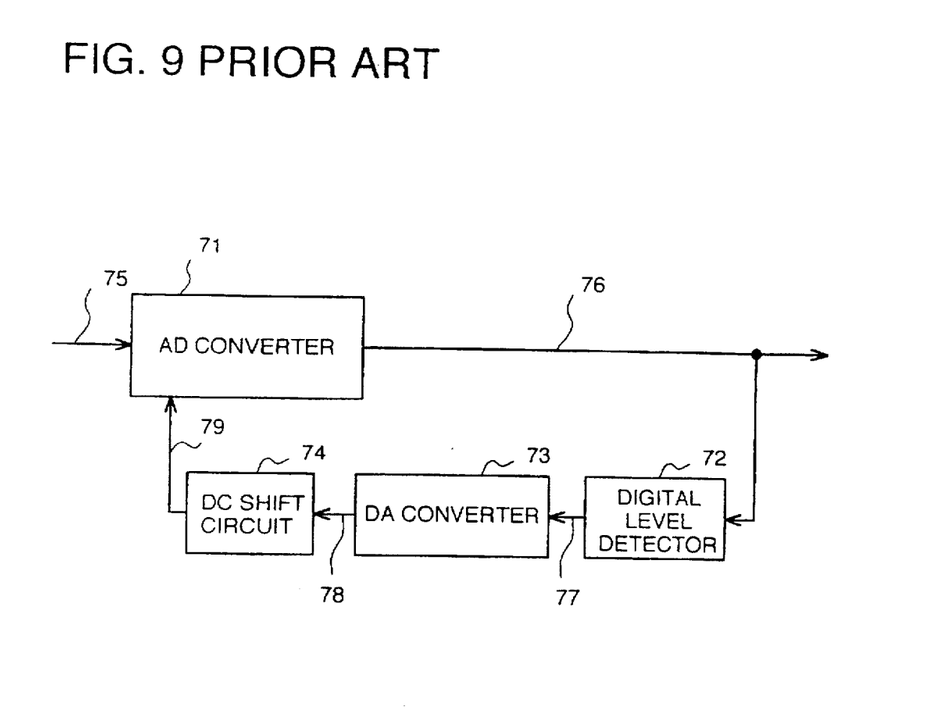
FIG. 9 is a block diagram of an AD converter circuit in a prior art.

FIG. 9 shows a block diagram of the prior art. An analog signal 75 is converted to a digital signal 76 at an AD converter 71 with reference to a reference voltage 79 supplied from a DC shift circuit 74. The highest quantization level of the AD converter 71 is adjusted corresponding to the reference voltage 79. Therefore, when the reference voltage 79 is large, a unit increment of the digital signal 76 represents a large voltage increment, and when the reference voltage 79 is small, a unit increment of the digital signal 76 represents a small voltage increment.

The level of the digital signal 76 detected by a digital level detector 72, is converted to an analog signal 78 by a digital to analog converter (hereinafter abbreviated to DA converter) 73. A DC shift circuit 74 produces the reference voltage 79 in proportion to the analog signal 78.

Thus, when the level of the analog signal 75 is low, the digital level detector 72 detects a low level, the output of the DA converter 73 becomes low, reducing the reference voltage 79, and the low level analog signal is converted to a digital signal having an incremental step of a small voltage difference, preventing quantizing errors. And when the level of the analog signal 75 is high, a high reference voltage 79 is supplied, preventing the high analog signal from going beyond the reference voltage.

The AD converter circuit shown in FIG. 9 not only solves the problems of the variable gain amplifier, but also eliminates the problem of the AD converter circuits of FIG. 8. Specifically, when the AD converter circuit of FIG. 9 is used as the AD converters 65I and 65Q of FIG. 8, an insufficient signal amplification at the variable gain amplifier 61 influenced by a presence of a strong undesired signal, will not produce quantizing errors, since a small reference voltage 79 is used in the AD converters 65I and 65Q for small input signals.

The AD converter circuit of the prior art has a problem that the circuit requires a DA converter, since the reference voltage 79 is produced from the digital signal 76 produced by the AD converter 71.

Another AD converter circuit wherein the reference voltage for quantization is controlled also in accordance with an output level of the AD converter, is disclosed in a Japanese patent application entitled "An automatic level control circuit of a sound recording and reproducing apparatus" and laid open as a Provisional Publication No. 31377/'90 (hereafter called a second prior art). Also in this second prior art, a DA converter is employed.

SUMMARY OF THE INVENTION

Therefore, a primary object of the present invention is to provide an AD converter circuit having small quantizing errors, wherein a variable reference voltage for quantization is generated with no DA converter.

In order to achieve this object, the reference voltage generator of a first embodiment of this invention generates a reference voltage for quantization from the level of an input analog signal.

Another object of this invention is to provide an AD converter circuit wherein desired signal components are digitized in high precision in the presence of undesired signal components, when, for example, a demodulated IF output signal containing undesired signal components is digitized.

In order to achieve this object, an AD converter of a second embodiment of this invention digitizes the desired signal components, extracted through a filter from the demodulated IF output signal, referring to a reference voltage which decreases in proportion to the signal level of the undesired signal components extracted through another filter.

In the first embodiment, a reference voltage, which increases in proportion to the input analog signal level, is obtained with no DA converter.

In the second embodiment, when undesired signal components are strong, the desired signal components in the output of the IF demodulator will be weak, because the undesired signal components and the desired signal components, included in the IF band, are collectively gain-controlled by the AGC. So, a reference voltage which decreases in proportion to the intensity of the undesired signal components is obtained with no DA converter, and used as the reference voltage referred to by the AD converter.

BRIEF DESCRIPTION OF THE DRAWINGS

Further objects, features, and advantages of this invention will become apparent from a consideration of the following description, the appended claims, and the accompanying drawings in which the same numerals indicate the same or the corresponding parts.

DETAILED DESCRIPTION OF THE PREFERRED EMBODIMENTS

Figure 1:
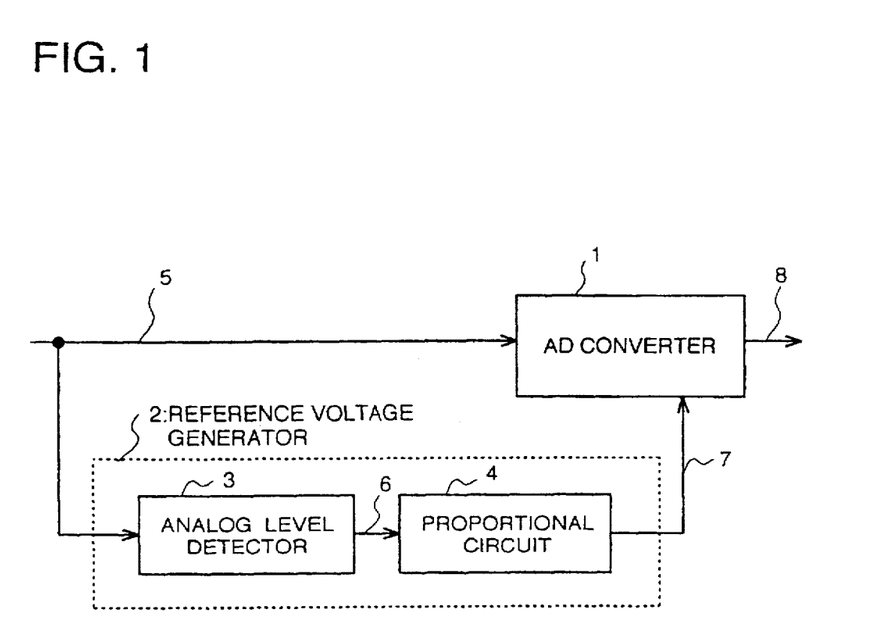
FIG. 1 is a block diagram of a first embodiment of the present invention.

Referring to FIG. 1, an input analog signal 5 at a signal input terminal of an AD converter 1 is digitized into a digital output signal 8 in reference to a reference voltage 7 supplied at a reference voltage input terminal of the AD converter 1. The input analog signal 5 is delivered to a signal voltage input terminal of a reference voltage generator 2 for generating the reference voltage 7 to be supplied to the AD converter 1. An analog level detector 3 in the reference voltage generator 2 detects an intensity level of the input analog signal 5, and the detected analog signal 6 is converted to the reference voltage 7 through a proportional circuit 4.

The AD converter 1 is, for example, a parallel comparator type AD converter. The analog level detector 3 is a level detector for detecting an intensity level, a peak level or an average level for example, of the input analog signal 5.

When the intensity level of the input analog signal 5 is low, a low reference voltage 7 is supplied to the AD converter 1, and when the intencity level of the input analog signal 5 is high, a high reference voltage 7 is supplied to the AD converter 1, and thus the input analog signal 5 is converted to a digital signal 8, wherein quantizing errors are suppressed.

Figure 2:
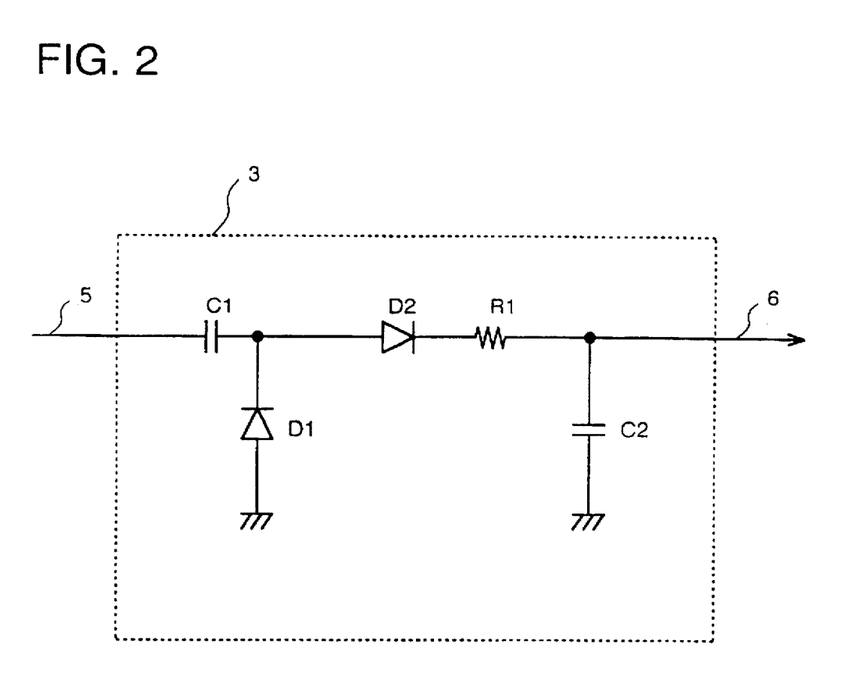
FIG. 2 is a circuit diagram of an analog level detector of FIG. 1.

FIG. 2 is a circuit diagram illustrating an example of the analog level detector 3. The analog level ditector 3 outputs a detected analog signal 6 charged in a capacitor C2 through a capacitor C1, a diode D2, and a resistor R1 with the input analog signal 5. A diode D1 clamps the bottom voltage through the capacitor C1 at the ground. The detected analog signal 6 represents an average intencity level of the input analog signal 5.

Figure 3:
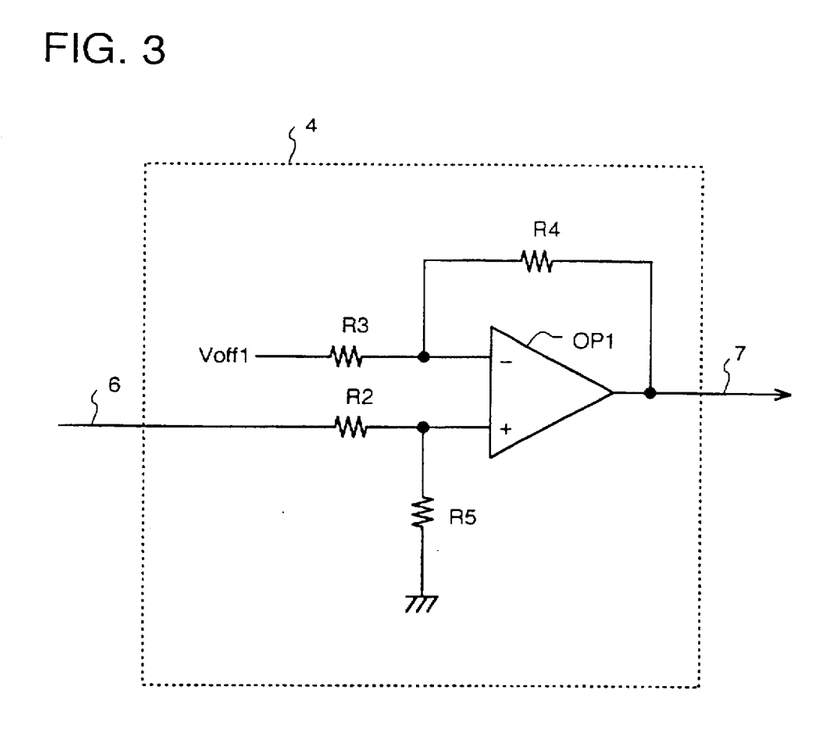
FIG. 3 is a circuit diagram of a proportional circuit of FIG. 1.

FIG. 3 shows an example of the proportional circuit 4. The detected analog signal 6 is connected to a positive input terminal of an operational amplifier OP1 through a voltage divider circuit of R2 and R5. An offset voltage Voff1 is connected to a negative input terminal of the OP1 through a resistor R3, and a resistor R4 feeds back the output of the OP1 to the negative input terminal of the OP1.

The value Vout of the reference voltage 7, which is the output of the OP1, is represented by $$Vout = \alpha Vin1 - \beta Voff1 \tag{1}$$

where Vin1 is the voltage of the detected analog signal 6. Positive coefficients $\alpha$ and $\beta$ are determined by R2, R3, R4 and R5. The equation (1) shows that the output voltage Vout increases in proportion to the input voltage Vin1.

Figure 4:
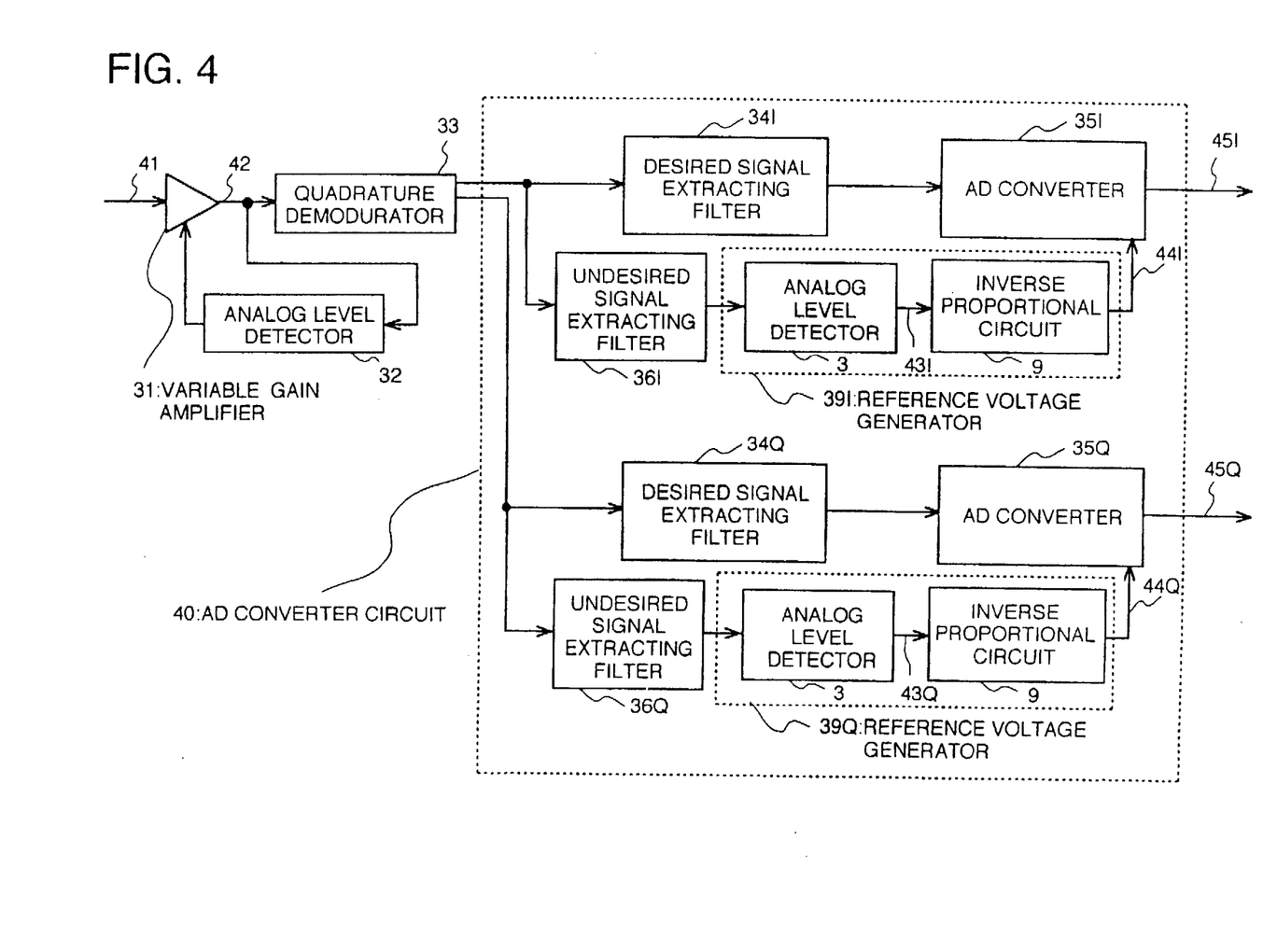
FIG. 4 is a block diagram of a second embodiment of this invention.

FIG. 4 is a block diagram of a second embodiment of the present invention. In this embodiment, an input analog signal 41 in an IF band is obtained by receiving a QPSK modulated signal. The input analog signal 41 is amplified into an amplified analog signal 42 by a variable gain amplifier 31. The variable gain amplifier 31 is automatic gain controlled with the output of an analog level detector 32 and the amplitude of the amplified analog signal 42 is maintained at a relatively constant level.

The amplified analog signal 42 in the IF band is demodulated by a quadrature demodulator 33 to a base band I-component signal and a base band Q-component signal. When there are undesired signal components whose frequency band is adjacent to the frequency band of the desired signal components, the variable gain amplifier is gain controlled with components both of desired signal and undesired signal and undesired components may appear both at the base band I-component signal and the base band Q-component signal.

At the base band, the undesired signal components can be separated from the desired signals. Desired signal components in the base band I-component signal are extracted by a desired signal extracting filter 34I and are delivered to an AD converter 35I, while desired signal components in the base band Q-component signal are extracted by another desired signal extracting filter 34Q and are delivered to another D converter 35Q.

Undesired signal components in the base band I-component signal are extracted by an undesired signal extracting filter 36I and are delivered to a reference voltage generator 39I, and undesired signal components in the base band Q-component signal are extracted by another undesired signal extracting filter 36Q and are delivered to another reference voltage generator 39Q.

Each of the reference voltage generators 39I and 39Q comprises an analog level detector 3 and an inverse proportional circuit 9. The analog level detector 3 has been explained in connection with FIG. 2.

Figure 5:
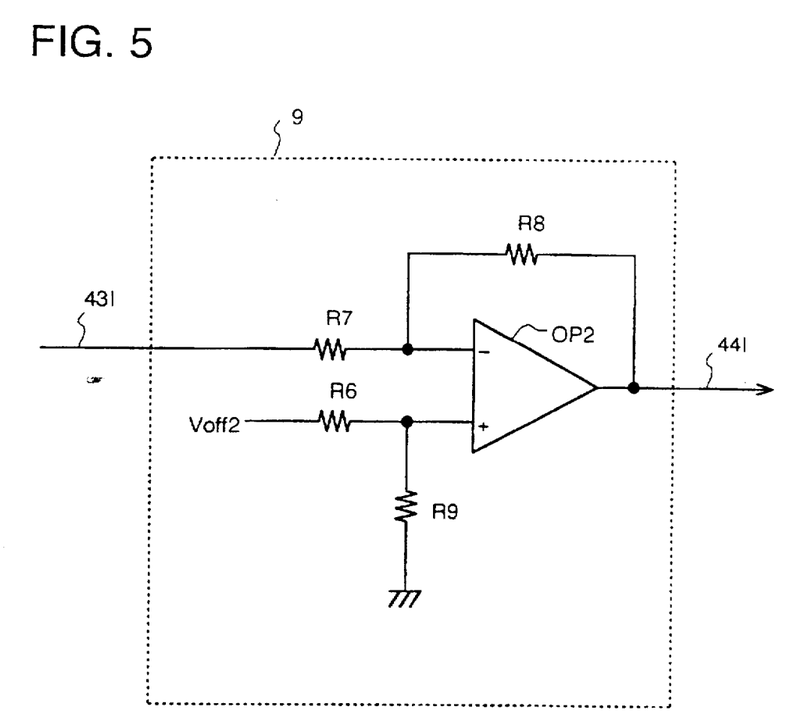
FIG. 5 is a circuit diagram of a decrease-in-proportion circuit of FIG. 4.

FIG. 5 shows an example of a circuit diagram of the inverse proportional circuit 9. A detected analog signal, for example, 43I of the output of the analog level detector 3 in the reference voltage generator 39I, is connected to the negative input terminal of an operational amplifier OP2 through a resistor R7. An offset voltage Voff2 is connected to the positive input terminal of the OP2 through a voltage divider composed of R6 and R9. The output of the OP2 is fed back through R8 to the negative input terminal of the OP2. The output voltage Vout of the OP2 is represented by $$Vout = \gamma Voff2 - \delta Vin2 \qquad (2)$$

where Vin2 is the voltage of 43I. As the coefficients $\gamma$ and $\delta$ are both positive, Vout decreases in proportion to Vin2.

The output voltage 44I from the reference voltage generator 39I is supplied to the AD converter 35I as the reference voltage, and the output voltage 44Q from the reference voltage generator 39Q is supplied to the AD converter 35Q as the reference voltage.

When the input analog signal 41 in the IF band includes a large amount of undesired signal components, the intensity of the desired signal components in the amplified signal 42 in the IF band decrease in proportion to the intensity of the undesired signal components, because the gain of the variable gain amplifier 31 is controlled to output the amplified signal 42, which is composed of desired signal components and the undesired signal components, at a constant intensity level.

In the embodiment, the output analog signals from the desired signal extracting filters 34I and 34Q are quantized with reference to the reference voltages 44I and 44Q which decrease in proportion to the intensity of the undesired signal.

Thus, when the intensity level of the undesired signal components are high, low level desired signal components are quantized by low level reference voltages 44I and 44Q, and the output digital signals 45I and 45Q are a high quality signal including few quantizing errors.

Figure 6:
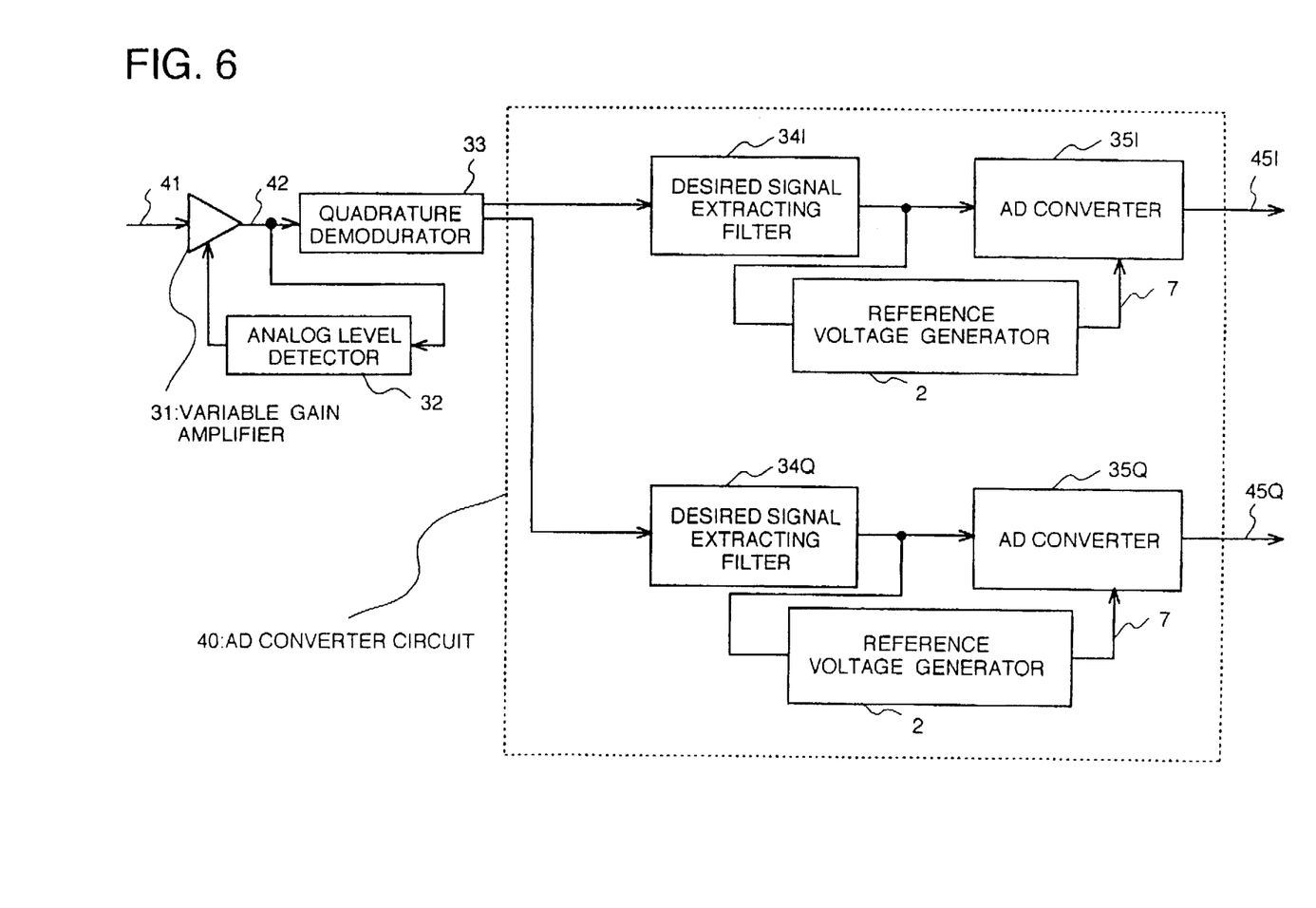
FIG. 6 shows a modification of FIG. 4.

Each of the output signals of the desired signal extracting circuits 34I and 34Q might be digitized by the AD converter circuit of FIG. 1 as shown in FIG. 6, but the AD converter circuit of FIG. 4 is preferred. The reason is that the reference voltage generator 2 has an interfering effect on the output signals of the desired signal extracting filters 34I and 35Q and may cause errors on the inputs to the AD converters 35I and 35Q.

What is claimed is:

1. An analog to digital converter circuit comprising:

an analog to digital converter for converting an input analog signal to a digital signal in accordance with a reference voltage; and a reference voltage generator for generating said reference voltage in proportion to an intensity level of said input analog signal, said reference voltage generator comprising:

an analog level detector for detecting the intensity level of said input analog signal; and a proportional circuit, responsive to said analog level detector, for generating said reference voltage in proportion to said intensity level detected by said analog level detector.

2. An analog to digital converter circuit of claim 1 wherein said proportional circuit comprises:

an operational amplifier with positive and negative input terminals and an output terminal, said output terminal providing said reference voltage to said analog to digital converter;

a voltage divider connected to the positive input terminal of said operational amplifier to voltage divide the output of said analog level detector;

a resistor connected to the negative input terminal of said operation amplifier and receiving an input offset voltage through said resistor; and a feedback resistor connected between the output terminal and the negative input terminal of said operational amplifier.

3. An analog to digital converter circuit for converting desired signal components of an analog signal to a digital signal, said analog signal being obtained by demodulating an output of an automatic gain controlled intermediate frequency amplifier in a radio receiver; said circuit comprising:

a filter for extracting undesired signal components included in the output of the automatic gain controlled intermediate frequency amplifier and having a frequency band adjacent to a frequency band of the desired signal components;

an analog to digital converter for converting the desired signal components to the digital signal in accordance with a reference voltage; and a reference voltage generator for generating said reference voltage, said reference voltage being inversely proportional to an intensity level of the undesired signal components extracted by said filter.

4. An analog to digital converter circuit of claim 3, wherein said reference voltage generator comprises:

an analog level detector detecting the intensity level of said undesired signal components; and an inverse proportional circuit, responsive to said analog level detector, for generating said reference voltage inversely proportional to said intensity level detected by said analog level detector.

5. An analog to digital converter circuit of claim 4 wherein said inverse proportional circuit comprises:

an operational amplifier with positive and negative input terminals and an output terminal, said output terminal providing said reference voltage to said analog to digital converter;

a voltage divider connected to the positive input terminal of said operational amplifier to voltage divide a received input offset voltage;

a resistor connected to the negative input terminal of said operational amplifier and receiving the output of said analog level detector; and a feedback resistor connected between the output terminal of said operational amplifier and the negative input terminal of said operational amplifier.

* * * * *

UNITED STATES PATENT AND TRADEMARK OFFICE
CERTIFICATE OF CORRECTION

PATENT NO.   : 5,748,129
DATED        : May 5, 1998
INVENTOR(S)  : Soichi TSUMURA It is certified that error(s) appears in the above-identified patent and that said Letters Patent is hereby corrected as shown below:

Col. 2, line 23, change "641" to --64I--.

Col. 2, line 26, change "651" to --65I--.

Col. 4, line 46, change "ditector" to --detector--.

Col. 4, line 51, change "intencity" to --intensity--.

Col. 5, line 22, change "341" to --34I--.

Col. 5, line 29, change "361" to --36I--.

Col. 5, line 30, change "391" to --36I--.

Col. 5, line 34, change "391" to --39I--.

Signed and Sealed this

Tenth Day of November 1998

*Attest:*

BRUCE LEHMAN

*Attesting Officer*     *Commissioner of Patents and Trademarks*